(12) United States Patent
Park (10) Patent No.: US 6,747,885 B2
(45) Date of Patent: Jun. 8, 2004

(54) TERNARY CONTENT ADDRESSABLE MEMORY DEVICE

(75) Inventor: Chul-Sung Park, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 9 days.

(21) Appl. No.: 10/303,662

(22) Filed: Nov. 25, 2002

(65) Prior Publication Data

US 2004/0001347 A1 Jan. 1, 2004

(30) Foreign Application Priority Data

Jun. 28, 2002 (KR) .......................................... 2002-3662

(51) Int. Cl.$^7$ ............................................. G11C 15/00
(52) U.S. Cl. ..................... 365/49; 365/168; 365/189.07
(58) Field of Search ..................... 365/49, 168, 189.07; 711/108

(56) References Cited

U.S. PATENT DOCUMENTS

| | | | |
|---|---|---|---|
| 4,646,271 A | 2/1987 | Uchiyama et al. | ............. 365/49 |
| 4,780,845 A | 10/1988 | Threewitt | ..................... 365/49 |
| 5,490,102 A | 2/1996 | Jubran | ......................... 365/49 |
| 5,495,382 A | 2/1996 | Albon | ......................... 365/49 |
| 6,044,055 A | 3/2000 | Hara | ............................ 369/116 |
| 6,108,227 A | * 8/2000 | Voelkel | ........................ 365/49 |
| 6,154,384 A | 11/2000 | Nataraj et al. | ................. 365/49 |
| 6,496,399 B1 | * 12/2002 | Choi et al. | ...................... 365/49 |
| 6,539,455 B1 | * 3/2003 | Khanna et al. | ............. 711/108 |
| 6,542,392 B2 | * 4/2003 | Yanagawa | ..................... 365/49 |
| 6,646,900 B2 | * 11/2003 | Tsuda et al. | ................... 365/49 |
| 6,665,202 B2 | * 12/2003 | Lindahl et al. | ............... 365/49 |
| 6,678,184 B2 | * 1/2004 | Lysinger et al. | .............. 365/49 |

* cited by examiner

Primary Examiner—Tan T. Nguyen
(74) Attorney, Agent, or Firm—F. Chau & Associates, LLC (57) ABSTRACT

A ternary content addressable memory (TCAM) having an array of cells arranged in rows and columns, each cell comprising of a main memory cell for storing a data bit and its complement and a pair of bit lines for carrying the data bit and its complement. A compare circuit having a pair of compare lines and an output node, the compare circuit coupled to the main memory cell for comparing the data bit and its complement with corresponding compare lines and outputting a compared signal at the output node. A match circuit coupled to the output node of the compare circuit and a match input line and a match output line, the match circuit for selectively connecting the match input line to the match output line based on the compared signal. A mask memory cell for storing and outputting mask data and a mask circuit coupled to the match circuit and the match input line and the match output line for masking the compared signal or for selectively connecting the match input line to the match output line based on the mask data.

29 Claims, 8 Drawing Sheets

TERNARY CONTENT ADDRESSABLE MEMORY DEVICE

This application claims priority to Korean Patent Application No. 2002-36626, filed on Jun. 28, 2002, the contents of which are herein incorporated by reference in their entirety.

BACKGROUND OF THE INVENTION

1. Field of the Invention

The present invention relates to a content addressable memory cell (hereinafter referred to as "CAM cell") and, more particularly, to a ternary content addressable memory cell (hereinafter referred to as "TCAM cell") capable of storing three states of information.

2. Discussion of Related Art

A CAM is a memory which is addressed by its own contents. Different from a RAM or ROM wherein an address is used to indicate a specific position in its memory cell array and outputs data stored in the addressed position, a CAM is externally supplied with data, and searches are made within the contents of the CAM for a match with the supplied data, and outputs an address depending on a comparison result. Each cell of a CAM includes comparison logic. A data value input to the CAM is compared with data stored in all the cells simultaneously. The matched result is the address. A CAM is commonly used in applications requiring fast searches for a pattern, a list, image data, etc.

A CAM cell may be classified into a binary CAM cell and a TCAM cell. A typical binary CAM cell is configured with a RAM cell to store one of two states of information, i.e., a logic "1" state and a logic "0" state. The binary CAM cell includes a compare circuit that compares data supplied externally (hereinafter, 'comparand data') with data stored in the RAM cell and drives a corresponding match line to a predetermined state when the comparand data and the stored data are matched. Examples of the binary CAM cells are disclosed in U.S. Pat. No. 4,646,271 entitled "CONTENT ADDRESSABLE MEMORY HAVING DUAL ACCESS MODE", U.S. Pat. No. 4,780,845 entitled "HIGH DENSITY, DYNAMIC, CONTENT-ADDRESSABLE MEMORY CELL", U.S. Pat. No. 5,490,102 entitled "LOW CAPACITANCE CONTENT-ADDRESSABLE MEMORY CELL", and U.S. Pat. No. 5,495,382 entitled "CONTENTS ADDRESSABLE MEMORY".

Figure 1:
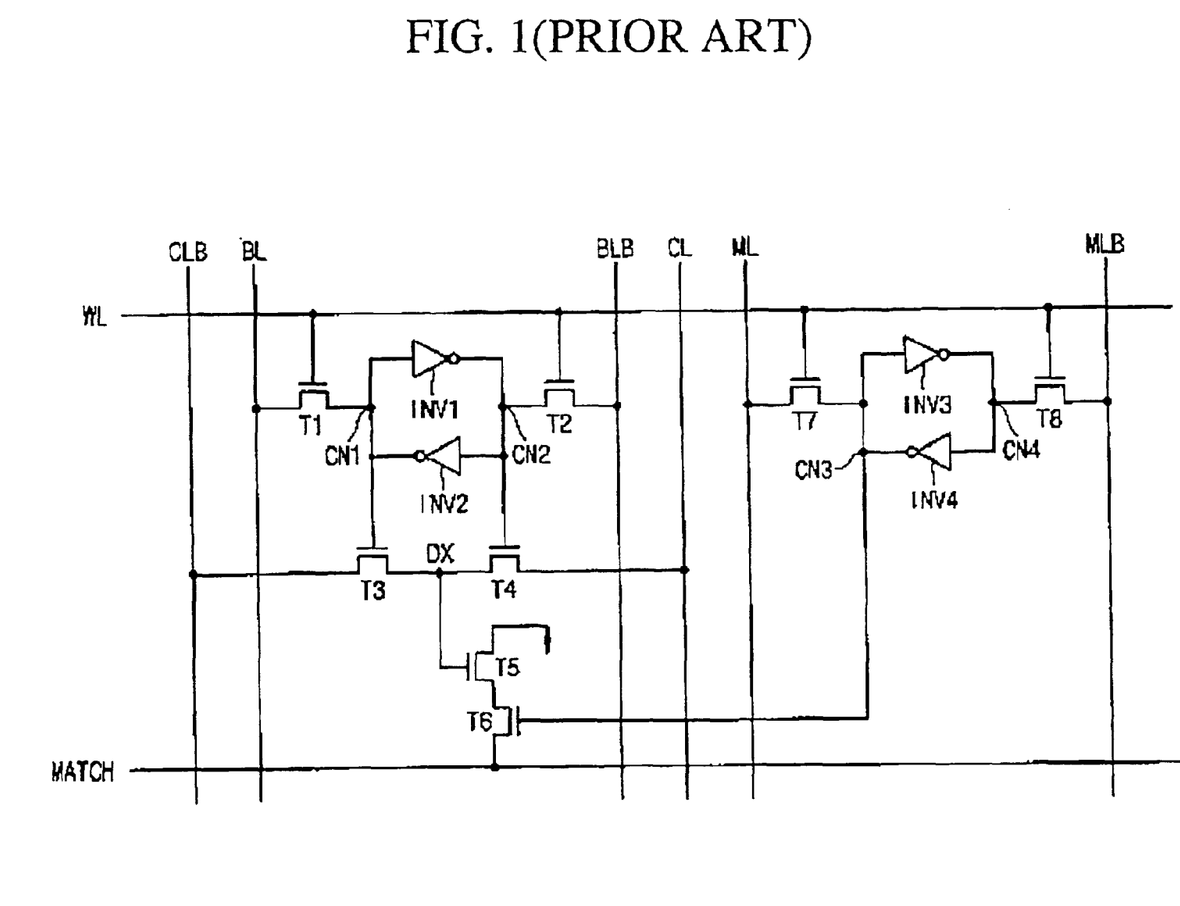
FIG. 1 is a circuit diagram of a conventional TCAM cell.

A TCAM cell can store one of three states of information, i.e., a logic "1" state, a logic "0" state, and a "don't care" state. The TCAM cell includes a main RAM cell to store one of two states of information, i.e., a logic "1" state or a logic "0" state, and a mask RAM cell to store local mask data. A comparison result of comparand data with data stored in the main RAM cell is masked with the mask data such that the comparison result does not affect a corresponding match line. Such a TCAM cell offers the user more flexibility to determine what data bits in a word will be masked during a compare operation. TCAM cells are further described, for example, in U.S. Pat. No. 6,044,055 entitled "CONTENT ADDRESSABLE MEMORY STORAGE DEVICE" and U.S. Pat. No. 6,514,384 entitled "TERNARY CONTENT ADDRESSABLE MEMORY CELL". FIG. 1 shows a conventional TCAM cell which includes a main memory cell having two NMOS transistors T1 and T2 and two inverters INV1 and INV2, a compare circuit consisting of three NMOS transistors T3, T4, and T5, a mask circuit consisting of an NMOS transistor T6, and a mask memory cell consisting of two NMOS transistors T7 and T8 and two inverters INV3 and INV4. The TCAM cell shown in FIG. 1 is described in U.S. Pat. No. 6,154,384. Signal lines represented as "BL" and "BLB" are used for data transmission of a main memory cell. Signal lines represented as "CL" and "CLB" are used for comparand data transmission. Signal lines represented as "ML" and "MLB" are used for mask data transmission of a mask memory cell. A TCAM is made from TCAM cells arranged in a matrix of rows and columns. TCAM cells in a row constitute one word, which may be 32, 64, 128 bits, or higher. Transistors T5 and T6 of the respective TCAM cells in a row constitute a wired-OR logic for a match line MATCH.

Although TCAMS afford advantages such as speedy access for numerous applications, drawbacks do exist. For example, when comparand data of the TCAM cell of FIG. 1 is not matched with data stored in a main memory cell, a discharge operation of a match line is carried out. Because the occurrence of unmatched words is usually greater than the occurrence of matched words, match lines (MATCH) corresponding to the unmatched words are frequently discharged, and more power is thereby consumed.

Figure 2A:
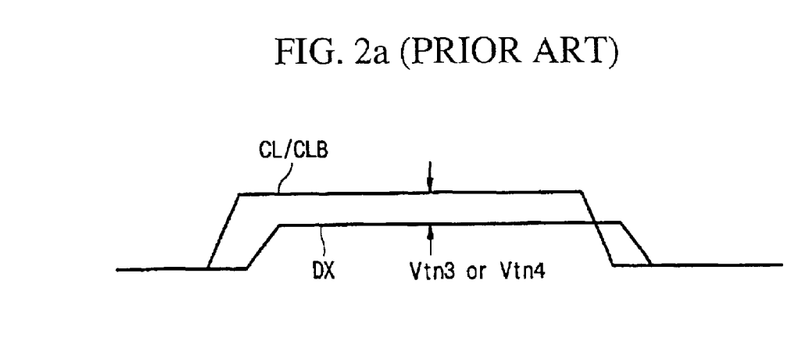
FIG. 2A shows a voltage level of an internal node of the TCAM cell of FIG. 1 during a compare operation.
Figure 2B:
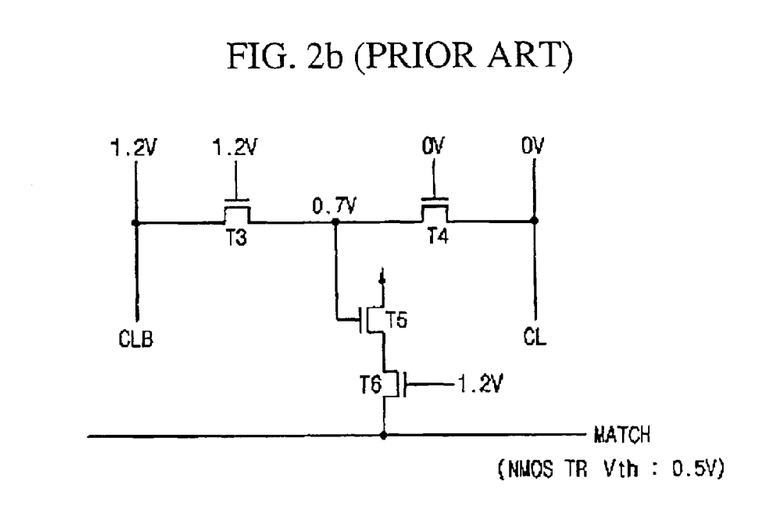
FIG. 2B shows voltage levels of internal nodes of the TCAM cell of FIG. 1.

Another problem is shown in FIG. 2A. A logic high level at node DX of FIG. 1 (VCL-Vtn4 or VCLB-Vtn3, wherein VCL represents a voltage of a CL line, VCLB represents a voltage of a CLB line, and the Vtn3 and Vtn4 represent threshold voltages of transistors T3 and T4, respectively) approaches a voltage only slightly higher than the threshold voltage of transistor T3 or T4. This high level voltage at DX is used to turn on transistor T5. To compensate for the lowered high voltage level, a big-sized transistor T5 must be used. The need for a bigger size transistor in each cell lowers the overall density of the TCAM. Even more problematic, if an operation voltage is lowered, the TCAM cell may not operate properly as the high level voltage at DX fails to meet the threshold voltage of transistor T5. For illustration, assuming that an operation voltage is 1.2V and a threshold voltage of an NMOS transistor T5 is 0.5V, a high level of the DX node thus becomes 0.7V, as shown in FIGS. 2A and 2B. Since this level is not high enough to turn on the NMOS transistor T5, the signal level on match line MATCH cannot be used to properly indicate a match or no-match.

Referring back to the TCAM cell of FIG. 1, if the compare result is not masked (by transistor T6), transistor T5 is turned off when comparand data is matched to data stored in a main memory cell and is turned on when there is no match. That is, when there is a match, a match line MATCH is maintained at a precharge state. When there is no match, charges of the match line are discharged through transistors T5 and T6. The discharge speed of the match line MATCH is a function of the number of unmatched bits in one word. For example, when only one bit of one word is unmatched, the charges of the match line MATCH are discharged through the transistors T5 and T6 of the unmatched TCAM cell. When n bits are unmatched among an m-bit word (n being a positive integer smaller than m), the charges of the match line MATCH are discharged through transistors nx (T5, T6) in n TCAM cells. The time needed to discharge the match line MATCH varies depending on the number of mismatched cells. To minimize the discharge speed variation, larger sized transistors T5 and T6 are needed. This, however, results in larger size TCAM cells. Therefore, a discharge speed difference also negatively affects the density of a TCAM.

In view of the foregoing, a need exists for a content addressable memory cell that is stably operable at low operation voltage, low power consumption, and facilitates manufacture of a high density CAM.

SUMMARY OF THE INVENTION

According to an aspect of the present invention, a ternary content addressable memory (TCAM) having an array of cells arranged in rows and columns is provided, each cell comprising: a main memory cell for storing a data bit and its complement and a pair of bit lines for carrying the data bit and its complement; a compare circuit having a pair of compare lines and an output node, the compare circuit coupled to the main memory cell for comparing the data bit and its complement with corresponding compare lines and outputting a compared signal at the output node; a match circuit coupled to the output node of the compare circuit and a match input line and a match output line, the match circuit for selectively connecting the match input line to the match output line based on the compared signal; a mask memory cell for storing and outputting mask data; and a mask circuit coupled to the match circuit and the match input line and the match output line for masking the compared signal or for selectively connecting the match input line to the match output line based on the mask data.

Preferably, the compare circuit includes a pair of PMOS transistors, and the pair of PMOS transistors are correspondingly coupled to the pair of compare lines and commonly connected at the output node of the compare circuit. Further, each of the match circuit and the mask circuit includes an NMOS transistor, wherein the NMOS transistors of the match circuit and the mask circuit are commonly connected at the match input line and the match output line. In one embodiment, the match input line is connected to the match output line upon an indication of a match from the compared signal.

According to another aspect of the invention, the match input line is connected to the match output line upon an indication of a mask condition from the mask data. The match input line is also preferably cascaded from and connected to a match output line of a preceding cell or the match output line is cascaded and connected to a match input line of a subsequent cell along the same row. The TCAM further includes a discharge circuit coupled to ground and to the match input line of the first cell of the same row and a precharge circuit coupled to a preset voltage and to the match output line of the last cell of the same row, wherein when all cells of the same row output a match, all the match input and output lines of the same row are discharged to substantially ground. According to this embodiment, the compare circuit includes a pair of PMOS and a pair of NMOS transistors, each PMOS transistor being commonly connected to a corresponding NMOS transistor and a corresponding compare line, and each of the match circuit and the mask circuit includes an NMOS transistor.

According to another aspect of the invention, each of the match circuit and the mask circuit includes a PMOS transistor, and the compare circuit includes a pair of NMOS transistors. The PMOS transistors are commonly connected at the match input line and at the match output line. The TCAM of this embodiment further includes a precharge circuit coupled to a preset voltage and to the match input line of the first cell of the same row and a discharge circuit coupled to ground and to the match output line of the last cell of the same row, wherein when all cells of the same row output a match, all the match input and output lines of the same row are precharged to substantially the preset voltage.

Preferably, the main memory cell and the mask memory cell are at least one of SRAM, DRAM, or nonvolatile memory (NVM) cells. The TCAM further includes a main word line and a mask word line which are connected to each other. Further, each of the match circuit and the mask circuit includes a PMOS transistor.

According to another embodiment of the invention, a content addressable memory (CAM) having an array of cells arranged in rows and columns is provided, each cell comprising: a main memory cell for storing a data bit and its complement and a pair of bit lines for carrying the data bit and its complement; a compare circuit having a pair of compare lines and an output node, the compare circuit coupled to the main memory cell for comparing the data bit and its complement with corresponding compare lines and outputting a compared signal at the output node; a match circuit coupled to the output node of the compare circuit and a match input line and a match output line, the match circuit for selectively connecting the match input line to the match output line based on the compared signal; a discharge circuit coupled to ground; a precharge circuit coupled to a preset voltage; the discharge circuit or the precharge circuit coupled to the match input line of the same row or the match output line of the same row, wherein when all cells of the same row output a match, all the match input and output lines of the same row are either precharged or discharged.

Preferably, the compared circuit includes a pair of PMOS transistors and the match circuit includes a NMOS transistor. According to an alternative embodiment, the compare circuit includes a pair of NMOS transistors and the match circuit includes a PMOS transistor.

Preferably, the TCAM further includes a mask circuit coupled to the match circuit and the match input line and the match output line for masking the compared signal or for selectively connecting the match input line to the match output line based on a mask data. A memory controller is further included for providing operation mode to the CAM.

A method is also provided for operating a content addressable memory (CAM) having an array of cells arranged in rows and columns, comprising the steps of: storing in a main memory cell a data bit and its complement; comparing the data bit and its complement with signals at corresponding compare lines and outputting a compared signal; selectively connecting a match input line to a match output line based on an indication of a match from the compared signal to form a match line; and setting the match line at a first voltage level when all of memory cells of the same row are matched, wherein said first voltage is a ground voltage or a power supply voltage.

These and other aspects and features of the present invention will become more apparent from the fully detailed description of preferred embodiments when read in connection with the accompanying drawings.

DETAILED DESCRIPTION OF PREFERRED EMBODIMENTS

Figure 3:
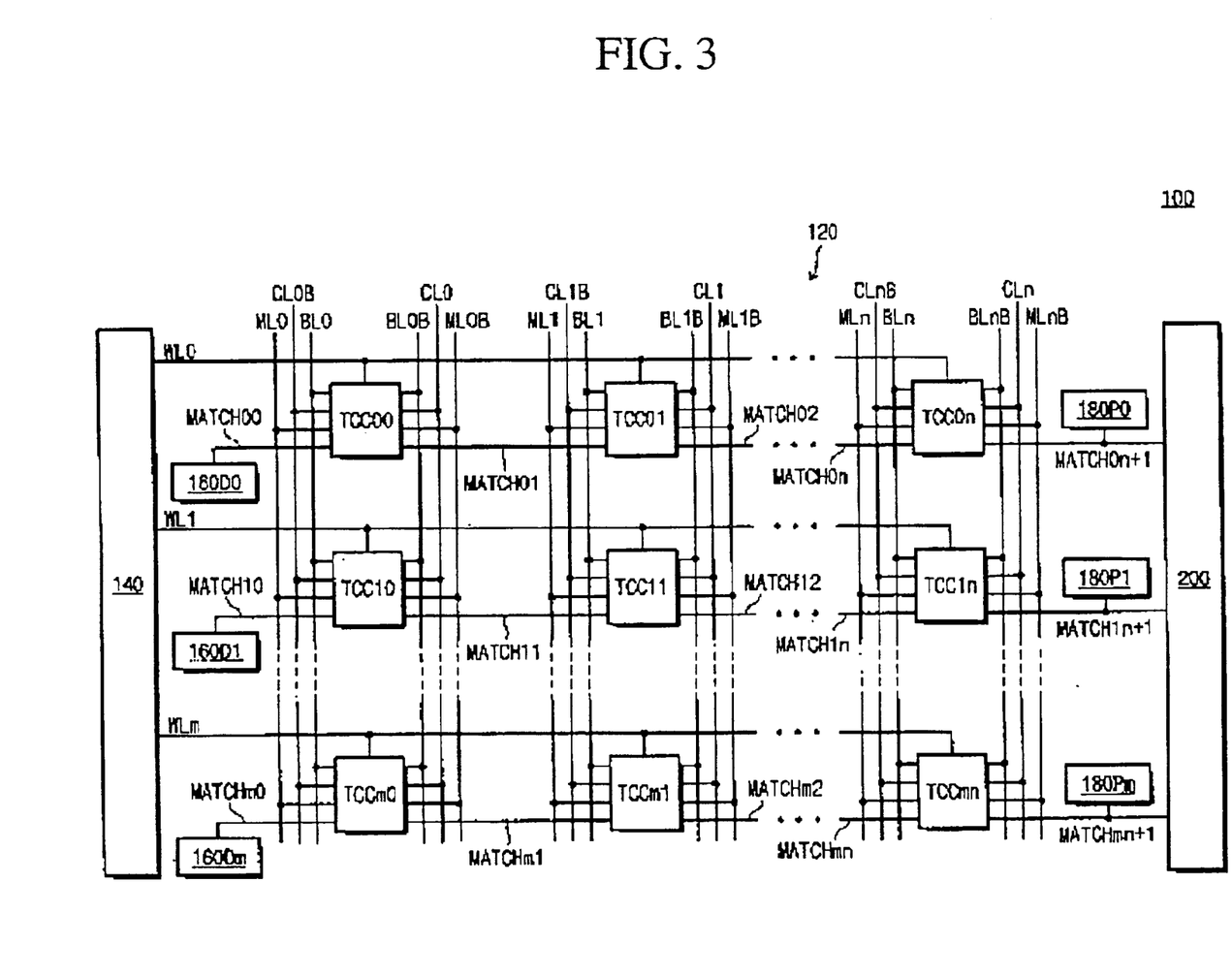
FIG. 3 is a block diagram of a ternary content addressable memory (TCAM) according to an embodiment of the present invention.

Referring to FIG. 3, a TCAM 100 according to the present invention includes an array 120 having a plurality of TCAM cells TCCij arranged in a matrix of rows and columns having 'i' rows and 'j' columns with i=0 to m and j=0 to n, m and n being natural integers. TCAM cells in each row are commonly coupled to the same wordline. For example, TCAM cells TCC00–TCC0n in a first row are commonly coupled to a wordline WL0. TCAM cells TCC10–TCC1n in a second row are commonly coupled to a wordline WL1. TCAM cells TCCm0-TCCmn in an mth row are commonly coupled to a wordline WLm. The wordlines WL0–WLm are coupled to a decoder 140, which selectively drives the wordlines WL0–WLm based on an operation mode instruction from a memory controller (not shown). For example, the decoder 140 selectively drives one of the wordlines WL0–WLm when storing data information in TCAM cells of any row or reading out data information therefrom. In a case where comparand data bits (constituting a search word) are compared with data bits (constituting a word) stored in TCAM cells of each row, the decoder 140 does not select all the wordlines WL0–WLm at the same time. TCAM cells of each row are commonly coupled to a bitline pair, a mask line pair, and a compare line pair. For example, TCAM cells TCC00–TCCm0 of a first column are commonly coupled to a bitline pair BL0 and BL0B, a mask line pair ML0 and ML0B, and a compare line pair CL0 and CL0B. TCAM cells TCC01–TCCm1 of a second column are commonly coupled to a bitline pair BL1 and BL1B, a mask line pair ML1 and ML1B, and a compare line pair CL1 and CL1B. TCAM cells TCC0n-TCCm n of an nth column are commonly coupled to a bitline pair BLn and BLnB, a mask line pair MLn and MLnB, and a compare line pair CLn and CLnB. A bitline pair BLi and BLiB of each column is used for transmitting data to be stored/read out to/from TCAM cells in a corresponding column. A mask line pair MLi and MLiB of each column is used for transmitting mask data to be stored/read out to/from TCAM cells in a corresponding column. A compare line pair CLi and CLiB of each column is used for transmitting comparand data.

The TCAM cell 100 according to an embodiment of the present invention includes match lines MATCH0–MATCHm that correspond to rows or wordlines WL0–WLm, respectively. Each of the match lines MATCH0–MATCHm is divided into a plurality of match line segments. For example, a match line MATCH0 of a first row is divided into match line segments MATCH00 to MATCH0n+1. A match line MATCH1 of a second row is divided into match line segments MATCH10 to MATCH1n+1. A match line MATCHm of an mth row is divided into match line segments MATCHm0 to MATCHmn+1. At each row, TCAM cells are coupled between adjacent match line segments, respectively. For example, a TCAM cell TCC00 positioned at a first row and a first column is coupled between match line segments MATCH00 and MATCH01. A TCAM cell TCC01 positioned at the first row and a second column is coupled between match line segments MATCH01 and MATCH02. A TCAM cell TCC0n positioned at the first row and an nth column is coupled between match line segments MATCH0n and MATCH0n+1. TCAM cells of the other rows are arranged the same as described above.

Discharge circuits 160D0, 106D1, . . . , and 160Dm are coupled to corresponding first match line segments MATCH00, MATCH10, . . . , and MATCHm0, each constituting match lines MATCH0 to MATCHm, respectively. The discharge circuits 160D0–160Dm electrically connect corresponding match line segments MATCH00 to MATCHm0 to a ground voltage, respectively for discharging the match lines. Precharge circuits 180P0, 180P1, . . . , and 180Pm are coupled to the last match line segments MATCH0n+1, MATCH1n+1, . . . , and MATCHmn+1, respectively. The precharge circuits 180P0–180Pm electrically connect corresponding match line segments MATCH0n+1-MATCHmn+1 to a power supply voltage, respectively. The discharge circuits 160D0–160Dm and the precharge circuits 180P0–180Pm operate or selectively operate based on an operation mode, preferably from a memory controller (not shown). The last match line segments MATCH0n+1–MATCHmn+1 of all rows are coupled to a match circuit 200, which generates an address corresponding to currently inputted comparand data in response to logic states of the match line segments MATCH0n+1-MATCHmn+1.

Figure 4:
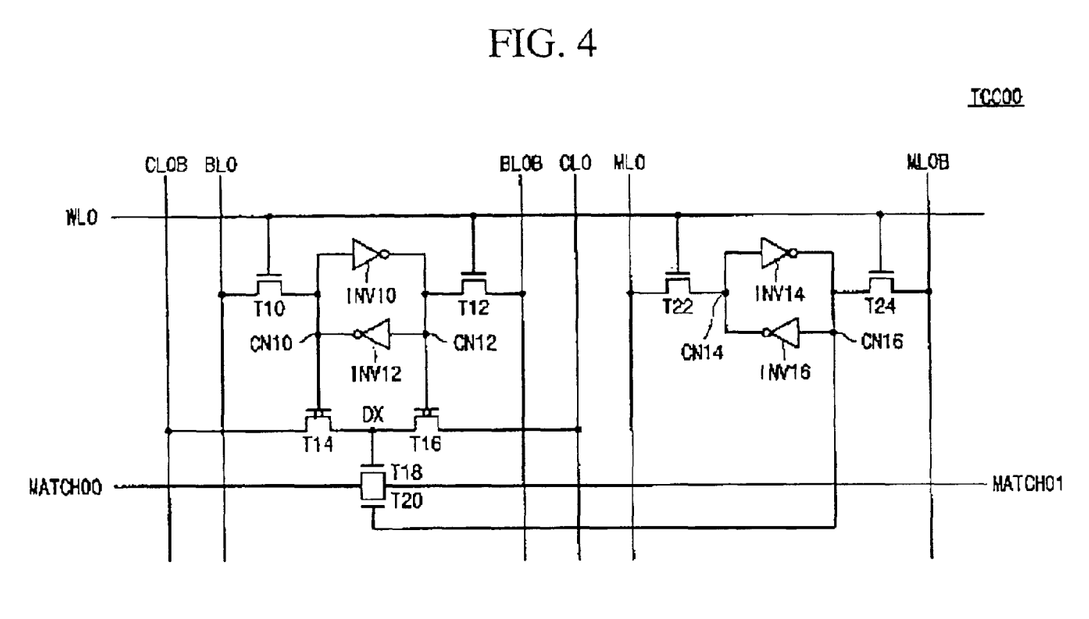
FIG. 4 is a circuit diagram of a TCAM cell in the TCAM shown in FIG. 3.

FIG. 4 shows a preferred embodiment of one TCAM cell, e.g., TCC00, shown in FIG. 3. The TCAM cell includes a main memory cell and a mask memory cell. Although the main memory cell and the mask memory cell shown herein is an SRAM cell, it is apparent to one ordinary skilled in the art that other types of memory cells e.g., DRAM cell, FRAM cells, or the like can be used.

The main memory cell is coupled to a bitline pair BL0 and BL0B, and includes two NMOS transistors T10 and T12 and two inverters INV10 and INV12. When the stored data in the main memory cell is "0", cell node CN10 has a logic low level and cell node CN12 has a logic high level. When the stored data in the main memory cell is "1", the cell node CN10 has a logic high level and the cell node CN12 has a logic low level. The mask memory cell is coupled to a mask line pair ML0 and MLB and a wordline WL0, and includes two NMOS transistors T22 and T24 and two inverters INV14 and INV16. When the mask data stored in mask memory cell is "0", cell node CN14 has a logic low level and cell node CN16 has a logic high level. When the stored mask data in mask memory cell is "1", the cell node CN14 has a logic high level and the cell node CN16 has a logic low level.

The CAM cell TCC00 further includes two PMOS transistors T14 and T16 and two NMOS transistors T18 and T20. The PMOS transistor T14 has a first electrode (drain or source) coupled to a complementary compare line CL0B, a second electrode (source or drain) coupled to an internal node DX, and a control electrode coupled to the cell node CN10 of the main memory cell. The PMOS transistor T16 has a first electrode (source or drain) coupled to a compare line CL0, a second electrode (drain or source) coupled to the internal node DX, and a control electrode coupled to the cell node CN12 of the main memory cell. The PMOS transistors T14 and T16 constitute a detection circuit for detecting whether comparand data transmitted through a compare line pair is matched with data stored in the main memory cell.

The NMOS transistor T18 has a first electrode (or source) coupled to a match line segment MATCH00, a second electrode (or drain) coupled to a match line segment MATCH01, and a control electrode coupled to the internal node DX. The NMOS transistor T18 constitutes a match circuit that electrically connects the match segments MATCH00 and MATCH01 when the comparand data is matched with the data stored in the main memory cell. The NMOS transistor T20 has a first electrode (or source) coupled to the match line segment MATCH00, a second electrode (or drain) coupled to the match line segment MATCH01, and a control electrode coupled to the cell node CN16 of the mask memory cell. The NMOS transistor T20 constitutes a mask circuit that electrically connects the match line segments MATCH00 and MATCH01 in response to the mask data stored in the mask memory cell. Although the main memory cell and the mask memory cell are coupled to the same wordline WL0, as shown in FIG. 4, it is apparent that the wordline may be separated into two wordline sections each for separately connecting to the main memory cell and the mask memory cell.

In the TCAM cell having the above-described structure, when the mask data is "0", the TCAM cell TCC00 is in an "X" or "don't care" state. When the mask data is "1", the TCAM cell TCC00 carries out a compare operation. More specifically, in the "X" state where the mask data is "0", the cell node CN14 of the mask memory cell has a logic low level and the cell node CN16 thereof has a logic high level. In this case, the NMOS transistor T20 is turned on and match line segments MATCH00 and MATCH01 are electrically connected to each other. This means the match line segments MATCH00 and MATCH01 are electrically connected to each other irrespective of the compare result of the comparand data with the data stored in the main memory cell. When the mask data is "1", the cell node CN14 of the mask memory cell has a logic high level and the cell node CN16 thereof has a logic low level. In this case, the NMOS transistor T20 is turned off. The match line segments MATCH00 and MATCH01 are electrically connected depending upon the compare result of the comparand data with the data stored in the main memory cell.

An exemplary compare function of the TCAM cell will now be described. When the stored data in the main memory cell is "0", the cell node CN10 of the main memory cell has a logic low level and the cell node CN12 thereof has a logic high level. When the TCAM cell is not masked, the TCAM cell carries out a compare function. When the stored data in the main memory cell is "1", the cell node CN10 has a logic high level and the cell node CN12 has a logic low level. A logic state of the internal node DX is determined depending on the compare result of the comparand data with the data stored in the main memory cell. As an illustration, when the stored data in the main memory cell is "0", the PMOS transistor T14 is turned on and the PMOS transistor T16 is turned off. When "0" comparand data is transmitted through the compare line pair CL0 and CL0B, a "1" data on the complementary compare line CL0B is transmitted to the internal node DX through the PMOS transistor T14. This causes the NMOS transistor T18 to be turned on, and causes the match line segments MATCH00 and MATCH01 to be electrically connected to each other. On the other hand, when a "1" comparand data is transmitted through the compare line pair CL0 and CL0B, a "0" data on the complementary compare line CL0B is transmitted to the internal node DX through the PMS transistor T14. This causes the NMOS transistor T18 to be turned off, and the match line segments MATCH00 and MATCH01 are not electrically connected.

Figure 5:
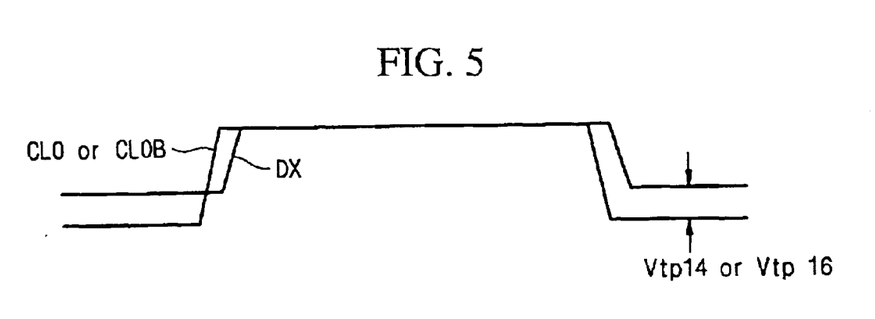
FIG. 5 shows a voltage level of an internal node of the TCAM cell shown in FIG. 4 during a compare operation of the TCAM cell.

FIG. 5 shows a voltage level of an internal node of the TCAM cell shown in FIG. 4 during a compare operation of the TCAM cell. When the internal node DX is discharged, the voltage at DX is dropped to a threshold voltage Vtp14 or Vtp 16 of the PMOS transistor T14 or T16.

When the data stored in the main memory is "1", the PMOS transistor T14 is turned off and the PMOS transistor T16 is turned on. When a "0" comparand data is transmitted through the compare line pair CL0 and CL0B, a "0" data on the compare line CL0 is transmitted to the internal node DX through the PMOS transistor T14. This causes the NMOS transistor T18 to be turned off, and causes the match line segments MATCH00 and MATCH01 to be electrically separated from each other. On the other hand, when a "1" comparand data is transmitted through the compare line pair CL0 and CL0B, a "1" data on the compare line CL0 is transmitted to the internal node DX through the PMOS transistor T14. This causes the NMOS transistor T18 to be turned on, and causes the match line segments MATCH00 and MATCH01 to be electrically connected to each other. Therefore, when comparand data is matched with data stored in the main memory cell, match line segments MATCH00 and MATCH01 are electrically connected to each other. On the other hand, when the comparand data is not matched therewith, the match line segments MATCH00 and MATCH01 are electrically separated from each other. At any row, when data bits stored in all the TCAM cells of the same row are matched with comparand data bits transmitted through corresponding compare line pairs, match line segments constituting a match line corresponding to the row are electrically connected to each other and to the corresponding discharge circuit 160 D[X]m. As a result, the match line corresponding to the row is substantially discharged to ground.

In the TCAM cell according to the invention, a first match line segment of each row is coupled to a ground voltage through a discharge circuit, and the last match line segment is coupled to a power supply voltage through a precharge circuit. The MATCH output in each row will be at the 'precharge' level or at '1' unless there is a match from the compare of stored data of all TCAM cells in the same row, in which case the MATCH output is discharged to '0'. Accordingly, a logic state of a match line of each row is varied only when all data bits of each word are matched with comparand data bits. This means the logic state of the match line is varied with the same speed irrespective of the number of unmatched data bits of one word.

As previously discussed, in the convention TCAM cell structure shown in FIG. 1, if an operation voltage is dropped, the TCAM cell cannot perform a compare function. Advantageously, according to the first embodiment of the TCAM cell structure according to the present invention, a logic high level of a compare line CL0 or a complementary compare line CL0B is transmitted to an internal node DX through a PMOS transistor T14 or T16, without reduction of threshold voltage. Thus, the TCAM cell normally carries out a compare function even when an operation voltage is low, thereby improving reliability of the TCAM cell. Additionally, because the logic high level of the compare line CL0 or the complementary compare line CL0B is transmitted to the internal node DX through the PMOS transistor T14 or T16 without reduction by threshold voltage, the driving capability of the NMOS transistor T18 is improved. With improved driving capability, the NMOS transistor T18 can be reduced in size. And, the overall density of the TCAM is higher.

Figure 6:
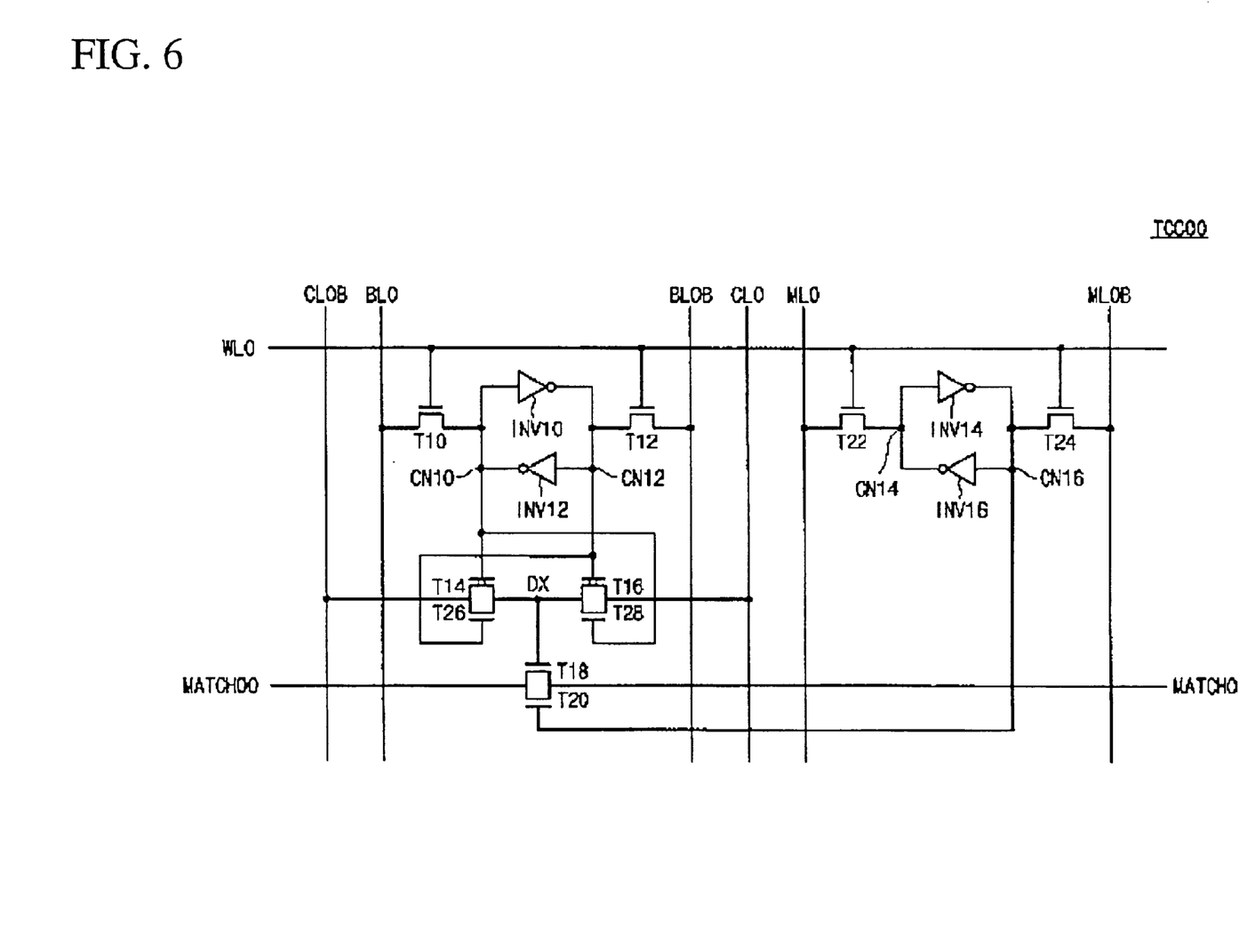
FIG. 6 is a circuit diagram of another embodiment of a TCAM cell in the TCAM shown in FIG. 3.

Further, since the number of unmatched words is much greater than that of matched words, the conventional TCAM cell structure of FIG. 1 has a considerably higher power consumption because the logic state of a match line is varied when a mismatch arises. On the other hand, the TCAM structure according to the invention requires considerably less power consumption because a logic state of a match line is varied only when a match arises. FIG. 6 shows a circuit diagram of a TCAM cell shown according to another embodiment of the present invention. In FIG. 6 and FIG. 4, same numerals denote same components. A TCAM cell of FIG. 6 is substantially identical to the TCAM cell of FIG. 4 except that NMOS transistors T26 and T28 are added in the circuit of FIG. 6. An NMOS transistor T26 has a first electrode coupled to a complementary compare line CL0B, a second electrode coupled to an internal node DX, and a control electrode coupled to a cell node CN12 of a main memory cell. An NMOS transistor T28 has a first electrode coupled to a compare line CL0, a second electrode coupled to the internal node DX, and a control electrode coupled to a cell node CN10 of the main memory cell. According to such a structure, a voltage of the internal node DX fully swings from a power supply voltage to a ground voltage.

Figure 7:
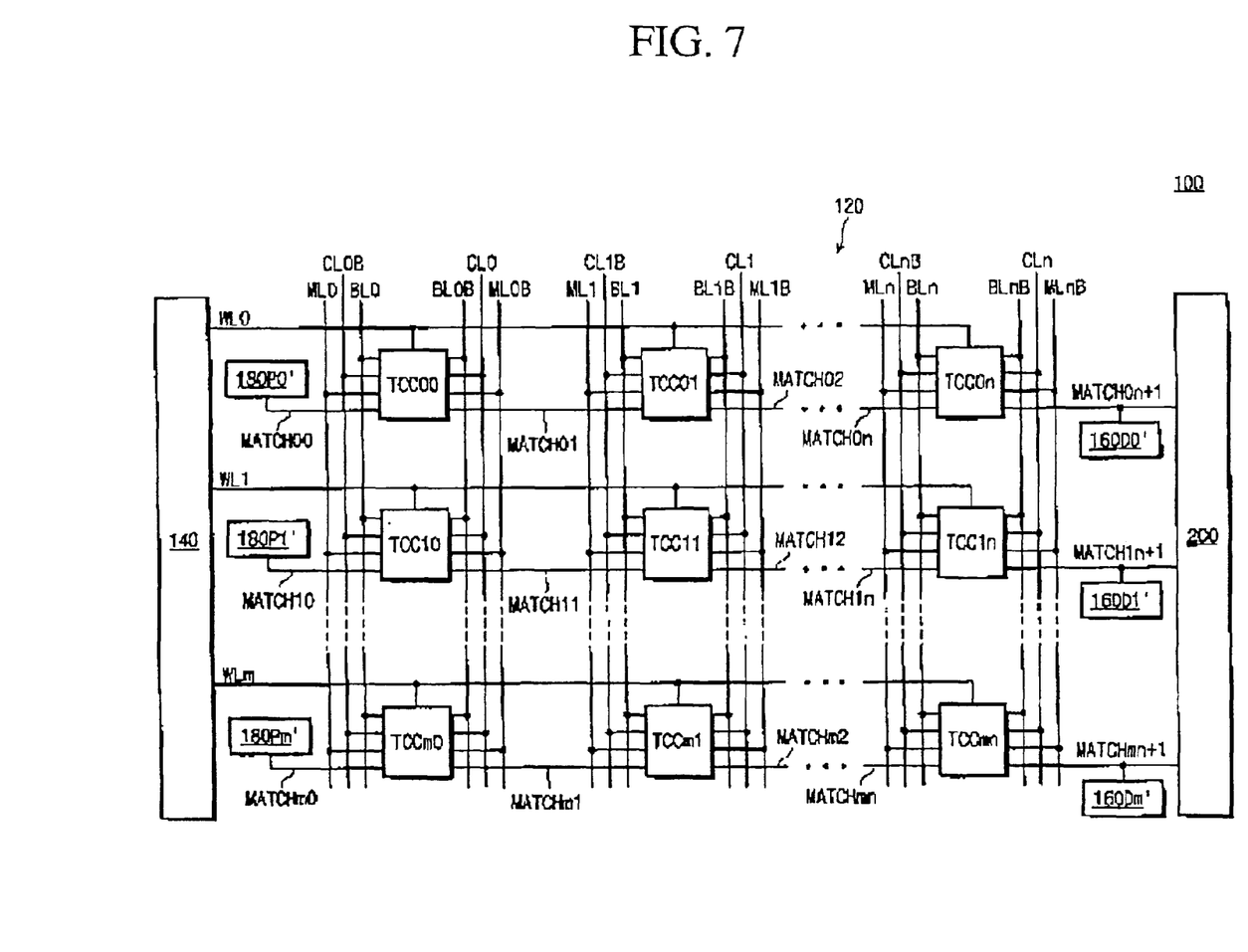
FIG. 7 is a block diagram of a ternary content addressable memory (TCAM) according to another embodiment of the present invention.
Figure 8:
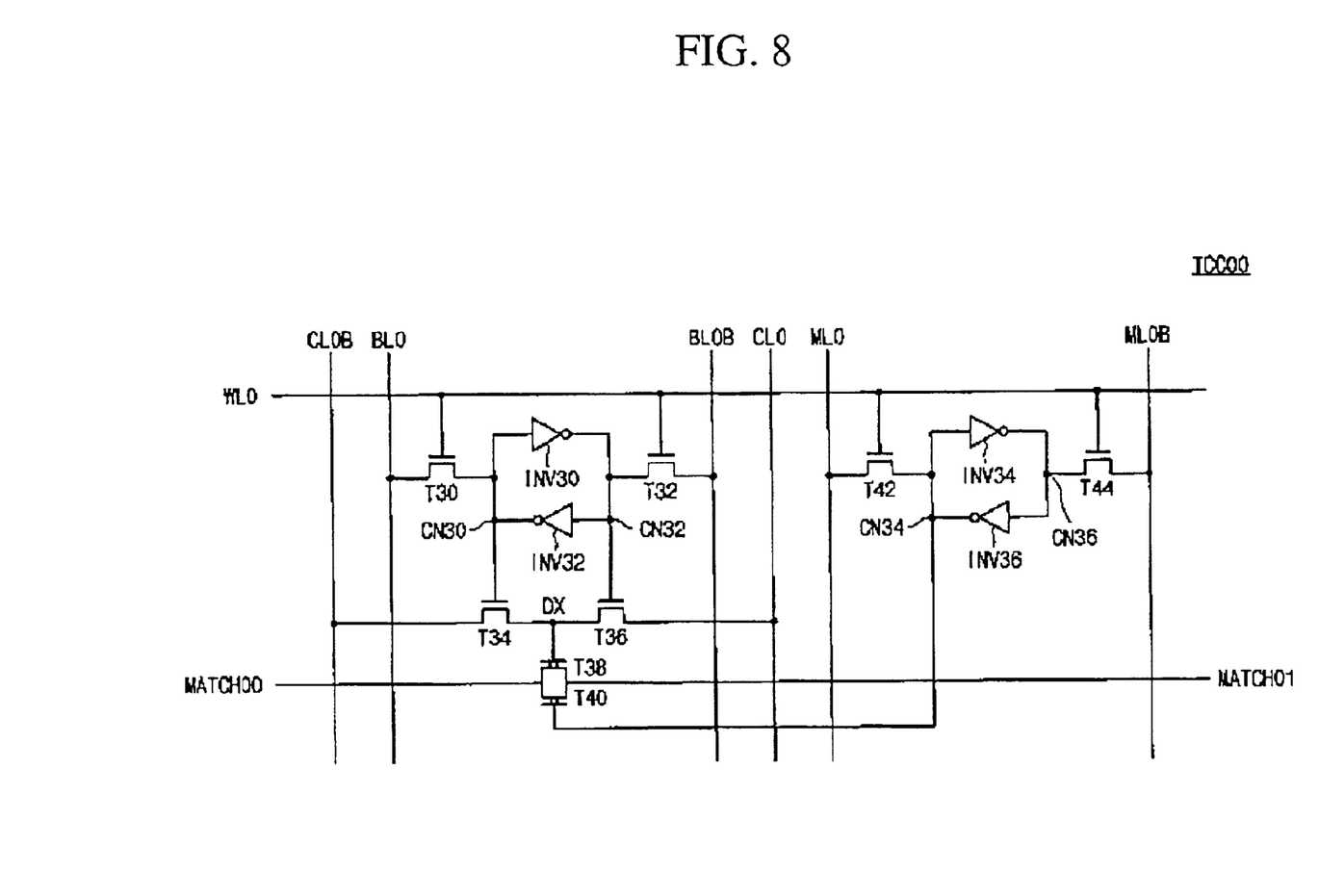
FIG. 8 is a circuit diagram of a TCAM cell in the TCAM shown in FIG. 7.

FIG. 7 shows a block diagram of a content addressable memory (CAM) according to a second embodiment of the present invention is illustrated in FIG. 7. In FIG. 7 and FIG. 3, same numerals denote same components. As shown in FIG. 7, a precharge circuit is coupled to a first match line segment of each row, and a discharge circuit is coupled to the last match line segment thereof. For example, a precharge circuit 180P0' is coupled to a first match line segment MATCH00 of a first row, and a discharge circuit 160D0' is coupled to the last match line segment MATCH0$n$+1 thereof. A precharge circuit 180P1' is coupled to a first match line segment MATCH10 of a second row, and a discharge circuit 160D1' is coupled to the last match line segment MATCH1$n$+1 thereof. A precharge circuit 180Pm' is coupled to a first match line segment MATCHm0 of the last row, and a discharge circuit 160Dm' is coupled to the last match line segment MATCHmn+1 thereof. FIG. 8 is a circuit diagram of one preferred embodiment of the TCAM cell structure in the TCAM in FIG. 7. Although a TCAM cell positioned at a first row and a first column is illustrated in FIG. 8, it will be understood that the other cells in the TCAM of FIG. 7 have the same structure. The TCAM cell TCC00 according to this embodiment of the invention includes a main memory cell and a mask memory cell. Although an SRAM cell is shown as the main memory cell and the mask memory cell, it is apparent to one skilled in the art that other memory cells e.g., DRAM cell, FRAM cell, and the like can also be used. The main memory cell is coupled to a bitline pair BL0 and BL0B and a wordline WL0, and includes two NMOS transistors T30, T32 and two inverters INV30 and INV32. When the stored data in the main memory is "0", cell node CN30 of the main memory cell has a logic low level and cell node CN32 has a logic high level. When the data stored in the main memory cell is "1", the cell node CN30 of the main memory cell has a logic high level and the cell node CN32 thereof has a logic low level. A mask memory cell is coupled to a mask line pair ML0 and ML0B and the wordline WL0, and includes two NMOS transistors T42 and T44 and two inverters INV34 and INV36. When the stored mask data in the mask memory cell is "0", cell node CN34 of the mask memory cell has a logic low level and cell node CN36 has a logic high level. When the mask data in this mask memory cell is "1", the cell node CN34 of the mask memory cell has a logic high level and the cell node CN36 has a logic low level.

The TCAM cell TCC00 according to this embodiment of the invention further includes two NMOS transistors T34 and T36 and two PMOS transistors T38 and T40. The NMOS transistor T34 has a first electrode (source or drain) coupled to a complementary compare line CL0B, a second electrode (drain or source) coupled to an internal node DX, and a control electrode coupled to a cell node CN30 of the main memory cell. The NMOS transistor T36 has a first electrode (source or drain) coupled to the compare line CL0, a second electrode (drain or source) coupled to the internal node DX, and a control electrode coupled to a cell node CN32 of the main memory cell. The NMOS transistors T34 and T36 constitute a detection circuit for detecting whether comparand data transmitted to a compare line pair is matched with data stored in a main memory cell. The PMOS transistor T38 has a first electrode (or source) coupled to a match line segment MATCH00, a second electrode (or drain) coupled to a match line segment MATCH01, and a control electrode coupled to the internal node DX. The PMOS transistor T38 constitutes a match circuit for electrically connecting the match line segments MATCH00 and MATCH01 to each other when the comparand data is matched with stored data. The PMOS transistor T40 has a first electrode (or source) coupled to the match line segment MATCH00, a second electrode (or drain) coupled to the match line segment MATCH01, and a control electrode coupled to a cell node CN34 of the mask memory cell. The PMOS transistor T40 constitutes a mask circuit for electrically connecting the match line segments MATCH00 and MATCH01 to each other in response to mask data stored in the mask memory cell.

According to such a circuit structure, when mask data is "0", the match line segments MATCH00 and MATCH01 are electrically connected to each other through the PMOS transistor P40 irrespective of compare result. Thus, the match line segment MATCH01 is charged to a power supply voltage from the precharge circuit 180P0' (see FIG. 7) through the match line segment MATCH00 and the PMOS transistor T40. When the mask data is "1", the electrical connection thereof is determined depending on the compare result. When the comparand data is matched with the data stored in the main memory cell, a logic level of the internal node DX becomes substantially a ground voltage, turning on transistor T38 to electrically connect the match line segments MATCH00 and MATCH01 to each other. On the other hand, when the comparand data is not matched therewith, the internal node DX is coupled to a signal line CL0 or CL0B (at a high level) turning off transistor T38 to electrically separate the match line segments MATCH00 and MATCH01 from each other.

Figure 9:
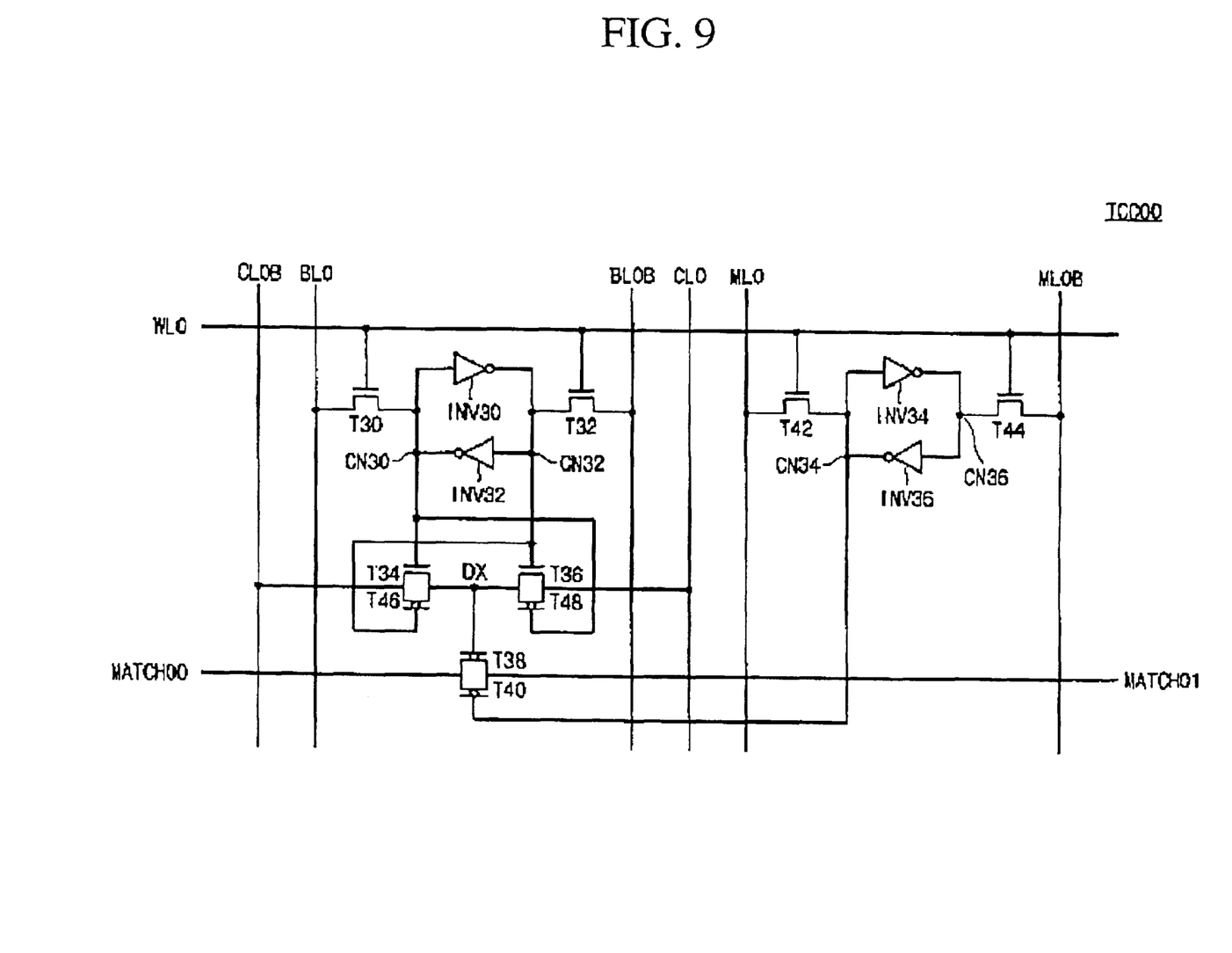
FIG. 9 is a circuit diagram of another embodiment of a TCAM cell in the TCAM shown in FIG. 7.

FIG. 9 is a circuit diagram showing another TCAM cell in the TCAM shown in FIG. 7. In FIG. 9 and FIG. 8, same numerals denote same components. The TCAM cell of FIG. 9 is substantially identical to the TCAM cell of FIG. 8, except that PMOS transistors T46 and T48 are added in FIG. 9. The PMOS transistor T46 has a first electrode coupled to a complementary compare line CL0B, a second electrode coupled to an internal node DX, and a control electrode coupled to a cell node CN32 of a main memory cell. The PMOS transistor T48 has a first electrode coupled to a compare line CL0, a second electrode coupled to the internal node DX, and a control electrode coupled to a cell node CN30 of the main memory cell. According to such a structure, a voltage of the internal node DX fully swings from a power supply voltage to a ground voltage. Otherwise, the TCAM cell of FIG. 9 may operate and obtain the same effect as the TCAM cell of FIG. 8.

As explained above, a ternary content addressable memory (TCAM) according to the embodiments of the present invention has a NAND-type match line structure, in which the level of a match line is changed, e.g., discharged/charged only when all data bits stored in TCAM cells of one word are matched with corresponding comparand data bits. This results in a reduction in power consumption and increased reliability and density. Transistors (e.g., T14 and T16 of FIG. 4) constituting a detection circuit are constructed to be complementary with a transistor (e.g., T18 of FIG. 4) constituting a match circuit.

As a result, the TCAM cells according to embodiments of the invention are suitable for use in a high-density CAM and is stably operable at a low voltage.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. A ternary content addressable memory (TCAM) having an array of cells arranged in rows and columns, each cell comprising:
    a main memory cell for storing a data bit and its complement and a pair of bit lines for carrying the data bit and its complement;
    a compare circuit having a pair of compare lines and an output node, the compare circuit coupled to the main memory cell for comparing the data bit and its complement with corresponding compare lines and outputting a compared signal at the output node;
    a match circuit coupled to the output node of the compare circuit and a match input line and a match output line, the match circuit for selectively connecting the match input line to the match output line based on the compared signal;
    a mask memory cell for storing and outputting mask data; and
    a mask circuit coupled to the match circuit and the match input line and the match output line for masking the compared signal or for selectively connecting the match input line to the match output line based on the mask data.

2. The TCAM according to claim 1, wherein the compare circuit includes a pair of PMOS transistors.

3. The TCAM according to claim 2, wherein the pair of PMOS transistors are correspondingly coupled to the pair of compare lines and commonly connected at the output node of the compare circuit.

4. The TCAM according to claim 2, wherein each of the match circuit and the mask circuit includes an NMOS transistor.

5. The TCAM according to claim 4, wherein the NMOS transistors of the match circuit and the mask circuit are commonly connected at the match input line and the match output line.

6. The TCAM according to claim 1, wherein the match input line is connected to the match output line upon an indication of a match from the compared signal.

7. The TCAM according to claim 1, wherein the match input line is connected to the match output line upon an indication of a mask condition from the mask data.

8. The TCAM according to claim 1, wherein the match input line is cascaded from and connected to a match output line of a preceding cell or the match output line is cascaded and connected to a match input line of a subsequent cell along the same row.

9. The TCAM according to claim 8, further including a discharge circuit coupled to ground and to the match input line of the first cell of the same row and a precharge circuit coupled to a preset voltage and to the match output line of the last cell of the same row, wherein when all cells of the same row output a match, all the match input and output lines of the same row are discharged to substantially ground.

10. The TCAM according to claim 1, wherein the compare circuit includes a pair of PMOS and a pair of NMOS transistors, each PMOS transistor being commonly connected to a corresponding NMOS transistor and a corresponding compare line.

11. The TCAM according to claim 10, wherein each of the match circuit and the mask circuit includes an NMOS transistor.

12. The TCAM according to claim 10, wherein each of the match circuit and the mask circuit includes a PMOS transistor.

13. The TCAM according to claim 1, wherein each of the match circuit and the mask circuit includes a PMOS transistor.

14. The TCAM according to claim 13, wherein the compare circuit includes a pair of NMOS transistors.

15. The TCAM according to claim 13, wherein the PMOS transistors are commonly connected at the match input line and at the match output line.

16. The TCAM according to claim 13, further including a precharge circuit coupled to a preset voltage and to the match input line of the first cell of the same row and a discharge circuit coupled to ground and to the match output line of the last cell of the same row, wherein when all cells of the same row output a match, all the match input and output lines of the same row are precharged to substantially the preset voltage.

17. The TCAM according to claim 1, wherein the main memory cell and the mask memory cell are SRAM cells.

18. The TCAM according to claim 1, wherein the main memory cell and the mask memory cell are DRAM cells.

19. The TCAM according to claim 1, wherein the main memory cell and the mask memory cell are nonvolatile memory (NVM) cells.

20. The TCAM according to claim 1, further including a main word line and a mask word line.

21. The TCAM according to claim 20, wherein the main word line and the mask word line are connected.

22. A content addressable memory (CAM) having an array of cells arranged in rows and columns, each cell comprising:
    a main memory cell for storing a data bit and its complement and a pair of bit lines for carrying the data bit and its complement;
    a compare circuit having a pair of compare lines and an output node, the compare circuit coupled to the main memory cell for comparing the data bit and its complement with corresponding compare lines and outputting a compared signal at the output node;
    a match circuit coupled to the output node of the compare circuit and a match input line and a match output line, the match circuit for selectively connecting the match input line to the match output line based on the compared signal;
    a discharge circuit coupled to ground;
    a precharge circuit coupled to a preset voltage;
    the discharge circuit or the precharge circuit coupled to the match input line of the same row or the match output line of the same row, wherein when all cells of the same row output a match, all the match input and output lines of the same row are either precharged or discharged.

23. The CAM according to claim 22, wherein the compared circuit includes a pair of PMOS transistors and the match circuit includes a NMOS transistor.

24. The CAM according to claim 22, wherein the compare circuit includes a pair of NMOS transistors and the match circuit includes a PMOS transistor.

25. The CAM according to claim 22, further including a mask circuit coupled to the match circuit and the match input line and the match output line for masking the compared signal or for selectively connecting the match input line to the match output line based on a mask data.

26. The CAM according to claim 22, further including a memory controller for providing operation mode to the CAM.

27. A method of operating a content addressable memory (CAM) having an array of cells arranged in rows and columns, comprising the steps of:

storing in a main memory cell a data bit and its complement;

comparing the data bit and its complement with signals at corresponding compare lines and outputting a compared signal;

selectively connecting a match input line to a match output line based on an indication of a match from the compared signal to form a match line; and setting the match line at a first voltage level when all of memory cells of the same row are matched.

28. The method of claim 27 wherein said first voltage is a ground voltage.

29. The method of claim 27 wherein said first voltage is a power supply voltage.

* * * * *

UNITED STATES PATENT AND TRADEMARK OFFICE
CERTIFICATE OF CORRECTION

PATENT NO. : 6,747,885 B2
DATED : June 8, 2004
INVENTOR(S) : Chul-Sung Park It is certified that error appears in the above-identified patent and that said Letters Patent is hereby corrected as shown below:

Title page,
Item [30], Foreign Application Priority Data, change "2002-3662" to
-- 2002-36626 --.

Signed and Sealed this

Seventh Day of December, 2004

JON W. DUDAS
*Director of the United States Patent and Trademark Office*